United States Patent
Deval et al.

(10) Patent No.: US 7,885,047 B2
(45) Date of Patent: Feb. 8, 2011

(54) ADAPTIVE ELECTROSTATIC DISCHARGE (ESD) PROTECTION OF DEVICE INTERFACE FOR LOCAL INTERCONNECT NETWORK (LIN) BUS AND THE LIKE

(75) Inventors: Philippe Deval, Lutry (CH); Patrick Besseux, Mont-sur-Rolle (CH); Randy Yach, Phoenix, AZ (US)

(73) Assignee: Microchip Technology Incorporated, Chandler, AZ (US)

( * ) Notice: Subject to any disclaimer, the term of this patent is extended or adjusted under 35 U.S.C. 154(b) by 391 days.

(21) Appl. No.: 12/174,903

(22) Filed: Jul. 17, 2008

(65) Prior Publication Data

US 2009/0128970 A1 May 21, 2009

Related U.S. Application Data

(60) Provisional application No. 60/989,514, filed on Nov. 21, 2007.

(51) Int. Cl.
*H02H 9/00* (2006.01)
(52) U.S. Cl. ...................................... 361/56
(58) Field of Classification Search .................... 361/56
See application file for complete search history.

(56) References Cited

U.S. PATENT DOCUMENTS

| | | | |
|---|---|---|---|
| 5,946,177 A | 8/1999 | Miller et al. | |
| 5,995,354 A | 11/1999 | Yu | |
| 7,102,862 B1 * | 9/2006 | Lien et al. | 361/56 |
| 7,382,592 B2 * | 6/2008 | Chen et al. | 361/56 |
| 7,495,878 B2 * | 2/2009 | Todd | 361/111 |
| 7,660,086 B2 * | 2/2010 | Rodgers et al. | 361/56 |
| 2002/0121924 A1 | 9/2002 | Yue | |
| 2004/0125521 A1 | 7/2004 | Salling et al. | |
| 2006/0250732 A1 | 11/2006 | Peachey | |
| 2007/0285854 A1 * | 12/2007 | Rodgers et al. | 361/56 |

OTHER PUBLICATIONS

International Search Report for PCT/US2008/084362, mailed May 7, 2009 (5 pages).
International Search Report and Written Opinion for application No. PCT/US2008/084365 (13 pages), May 7, 2009.

* cited by examiner

*Primary Examiner*—Ronald W Leja
(74) *Attorney, Agent, or Firm*—King & Spalding L.L.P.

(57) ABSTRACT

Adaptive electrostatic discharge (ESD) protection of a device interface has very good ESD robustness when it is handled or when installed into or removed from a system. And has robust immunity to DPI, electromagnetic interference (EMI) and the like, when it is operational in a system. There is a significant capacitive coupling between the drain and gate of a ESD protection metal oxide semiconductor (MOS) device to enhance ESD protection and lower snap back voltage thereof whenever there is no (or a low level) DPI on the external connection to be protected. Whereupon when a significant DPI/EMI signal is detected on the external connection, the capacitive coupling between the drain and gate of the MOS ESD protection device is disconnected, bypassed or attenuated so that DPI/EMI immunity of the device is enhanced.

18 Claims, 6 Drawing Sheets

ADAPTIVE ELECTROSTATIC DISCHARGE (ESD) PROTECTION OF DEVICE INTERFACE FOR LOCAL INTERCONNECT NETWORK (LIN) BUS AND THE LIKE

RELATED PATENT APPLICATION

This application claims priority to commonly owned U.S. Provisional Patent Application Ser. No. 60/989,514; filed Nov. 21, 2007; entitled "Adaptive Electrostatic Discharge (ESD) Protection of Device Interface for Local Interconnect Network (LIN) Bus and the Like," by Philippe Deval, Patrick Besseux and Randy Yach; and is hereby incorporated by reference herein for all purposes. This application is also co-pending with commonly owned U.S. patent application Ser. No. 12/174,802; filed Jul. 17, 2008; entitled "Adaptive Electrostatic Discharge (ESD) Protection of Device Interface for Local Interconnect Network (LIN) Bus and the Like," by Philippe Deval, Patrick Besseux and Randy Yach.

TECHNICAL FIELD

The present disclosure relates to integrated circuit devices that are capable of interfacing to a Local Interconnect Network (LIN) bus and the like, e.g., as used in automotive electronics, and more particularly, to achieving high electrostatic discharge (ESD) robustness when handled, plugged into or removed from the LIN bus and the like, and having high direct power injection (DPI) immunity when operating on the LIN bus and the like.

BACKGROUND

The ever-increasing importance of electronics in automobiles brings with it a growing challenge and need for low-cost, reliable electronic systems and subsystems that require input-output devices that interface with sensors and actuators. These systems and subsystems are not isolated, and must communicate with each other.

Historically, automotive electronics have been built up using discrete, smaller integrated circuits. They relied on proprietary, dedicated wire communication schemes, at least for many sensor systems, and directly wired power outputs to the actuators. This led to large printed-circuit boards (PCBs), large engine-control unit (ECU) housing sizes, and excessive wiring bundles. Wiring brings with it other problems since it consumes space, adds weight and expense, is subject to the vehicle's electromagnetic noise, and can be difficult to trouble shoot and maintain.

Fortunately, advances in vehicle-networking standards and mixed-signal semiconductor processes are addressing these issues and introducing new possibilities to distribute intelligent systems throughout a vehicle. The trend in vehicle-networking standardization includes the wide adoption of Controller Area Network (CAN) and the Local Interconnect Network (LIN) architecture, now in version 2.1.

These network standards are providing a balance between performance and cost optimization across automotive systems. CAN provides a high-speed network for chassis, power-train and body-backbone communications, while LIN answers the need for a simple network for sensor and actuator subsystems that reduces cost and improves robustness through standardization. The wide use of CAN and the availability of LIN coincides with advances in mixed-signal semiconductor-process technologies that can bring together all the functionality needed for smaller automotive systems onto a single integrated circuit (IC), or a few ICs for more advanced systems.

While LIN was originally targeted for the vehicle's body electronics, it is proving its value in new ways with many implementations outside of body electronics. Among the automotive-electronic bus standards available, LIN provides the best solution for the communication needs of most sensors and actuators which are normally dedicated to a single system. They can be viewed as subsystems and are well served by LIN, which has been defined to fill a sub-network role in the vehicle. The maximum LIN specified data rate of twenty kilobits per second (kbps) is sufficient for most sensors and actuators. LIN is a time-triggered, master-slave network, eliminating the need for arbitration among simultaneously reporting devices. It is implemented using a single wire communications bus, which reduces wiring and harness requirements and thus helps save weight, space and cost.

Defined specifically for low-cost implementation of vehicle sub-network applications by the LIN Consortium, the LIN standard aligns well to the integration capabilities of today's mixed-signal semiconductor processes. The LIN protocol achieves significant cost reduction since it is fairly simple and operates via an asynchronous serial interface (UART/SCI), and the slave nodes are self-synchronizing and can use an on-chip RC oscillator instead of crystals or ceramic resonators. As a result, silicon implementation is inexpensive, making LIN very suitable for the mixed-signal process technologies typically used to manufacture signal-conditioning and output ICs for automotive subsystems.

The LIN master node is normally a bridge node of the LIN sub-network to a CAN network, and each vehicle will typically have several LIN sub-networks. The master LIN node has higher complexity and control, while the slave LIN nodes are typically simpler, enabling their integration in single IC subsystems. Through the use of standardized vehicle-networking architectures, it is possible to build a feature- and diagnostic-rich system that requires only three wires (LIN, battery and ground)

For obvious reasons of reliability and safe operation a very high immunity for both ESD (Electro Static Discharge) and DPI (Direct Power Injection) is required for all the LIN modules. This high ESD and DPI immunity specially applies to the pins of a LIN module that are connected to the external world (e.g., battery pin, LIN pin, etc.)

The pins of a LIN module that are connected to the system (external world) are highly exposed to ESD discharge when the module is handled or plugged into the system. A LIN module must be able to be safely installed or removed by any one. Therefore the ESD immunity needs to be very high (greater than several kilovolts) for all of the LIN module pins since the standard industry rules for handling an electrical module cannot be properly enforced in the automotive industry.

In addition once installed, any pin connected to the LIN system may see a high level of interferences coming from the other communications busses and/or power supply lines. The reason is that the communications busses and power supply lines cannot be wired with efficient shielding or differential signal lines (except for CAN) for cost reasons. Therefore the high interference levels present in automobile electrical and control systems must not impact the integrity of the desired data transiting on the LIN bus.

Thus very high immunity to both ESD and DPI is required for any pin of a chip that is directly routed to the connector of a LIN module. A commonly used device for ESD protection is a grounded gate metal oxide semiconductor (GGMOS) transistor that has its gate grounded through an ESD protection resistor. A common technique to enhance the ESD robustness of the GGMOS transistor used for ESD protection of a respective external connection (pin) is to have some capacitive coupling between the drain and the gate of the GGMOS transistor protection device.

Unfortunately this ESD protection technique dramatically increases the sensitivity of the pin to noise interferences or DPI: The capacitive coupling between the drain and the gate allows high frequencies to reach the gate of the protection device and turn it on. This corrupts the desired data flow. Therefore the capacitive coupling significantly degrades a high DPI robustness. Therefore, standard ESD protection techniques are not well suited to achieve a high noise and interference immunity for DPI and the like.

SUMMARY

A need exists for ESD protection of a device when being handled, installed and/or removed from a system, and a need exists for high DPI robustness when the device is operating in a system. As discussed hereinabove, a LIN module and the like must have very good ESD robustness when it is handled or when installed into or removed from a LIN system. Also the LIN module must have robust immunity to DPI, electromagnetic interference (EMI) and the like, when it is connected to the LIN system and is operational. Fortunately these two situations do not occur simultaneously. Therefore the ESD robustness and DPI/EMI immunity requirements may be considerate separately from a design standpoint.

Therefore according to the teachings of this disclosure, by using a significant capacitive coupling between the drain and gate of a metal oxide semiconductor (MOS) electrostatic discharge (ESD) device when no (or low level) DPI is present on the pin to protect, and then controllably disconnecting, bypassing and/or attenuating this capacitive coupling when DPI is detected on the pin, allows robust ESD protection or DPI/EMI immunity as appropriate.

According to a specific example embodiment of disclosure, an integrated circuit device having adaptive electrostatic discharge (ESD) protection and noise signal rejection comprises: an external connection adapted for connection to a data bus; a data bus interface coupled to the external connection; a circuit function coupled to the data bus interface; an ESD protection circuit coupled to the external connection and a common of the integrated circuit device; an ESD enhancement capacitor coupled to the external connection; an ESD capacitor control, wherein the ESD capacitance control couples the ESD enhancement capacitor into the ESD protection circuit when an input of the ESD capacitor control is at a first voltage, and decouples the ESD enhancement capacitor from the ESD protection circuit when the input of the ESD capacitor control is at a second voltage; a high pass filter coupled to the external connection, wherein the high pass filter passes high frequency noise signals but not low frequency data signals; and a signal amplitude detector coupled to the high pass filter, wherein when the high frequency noise signals are present on the external connection the signal amplitude detector applies the second voltage to the ESD capacitor control, and when there are substantially no high frequency noise signals are on the external connection the signal amplitude detector applies the first voltage to the ESD capacitor control.

According to another specific example embodiment of disclosure, an integrated circuit device having adaptive electrostatic discharge (ESD) protection and noise signal rejection comprises: an external connection adapted for connection to a data bus; a data bus interface coupled to the external connection; a circuit function coupled to the data bus interface; an ESD protection circuit coupled to the external connection and a common of the integrated circuit device; an ESD enhancement capacitor coupled to the external connection; an ESD capacitor control, wherein the ESD capacitance control proportionally couples the ESD enhancement capacitor into the ESD protection circuit when an input of the ESD capacitor control is at certain control voltages until a maximum voltage is reached then the ESD capacitor control decouples the ESD enhancement capacitor from the ESD protection circuit when the input of the ESD capacitor control is at the maximum voltage; a high pass filter coupled to the external connection, wherein the high pass filter passes high frequency noise signals but not low frequency data signals; and a signal amplitude detector coupled to the high pass filter, wherein when the high frequency noise signals are present on the external connection the signal amplitude detector applies the certain control voltages to the ESD capacitor control in proportion to the high frequency noise signals received by the signal amplitude detector.

BRIEF DESCRIPTION OF THE DRAWINGS

A more complete understanding of the present disclosure may be acquired by referring to the following description taken in conjunction with the accompanying drawings wherein.

While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein, but on the contrary, this disclosure is to cover all modifications and equivalents as defined by the appended claims.

DETAILED DESCRIPTION

Referring now to the drawing, the details of specific example embodiments are schematically illustrated. Like elements in the drawings will be represented by like numbers, and similar elements will be represented by like numbers with a different lower case letter suffix.

Figure 1:
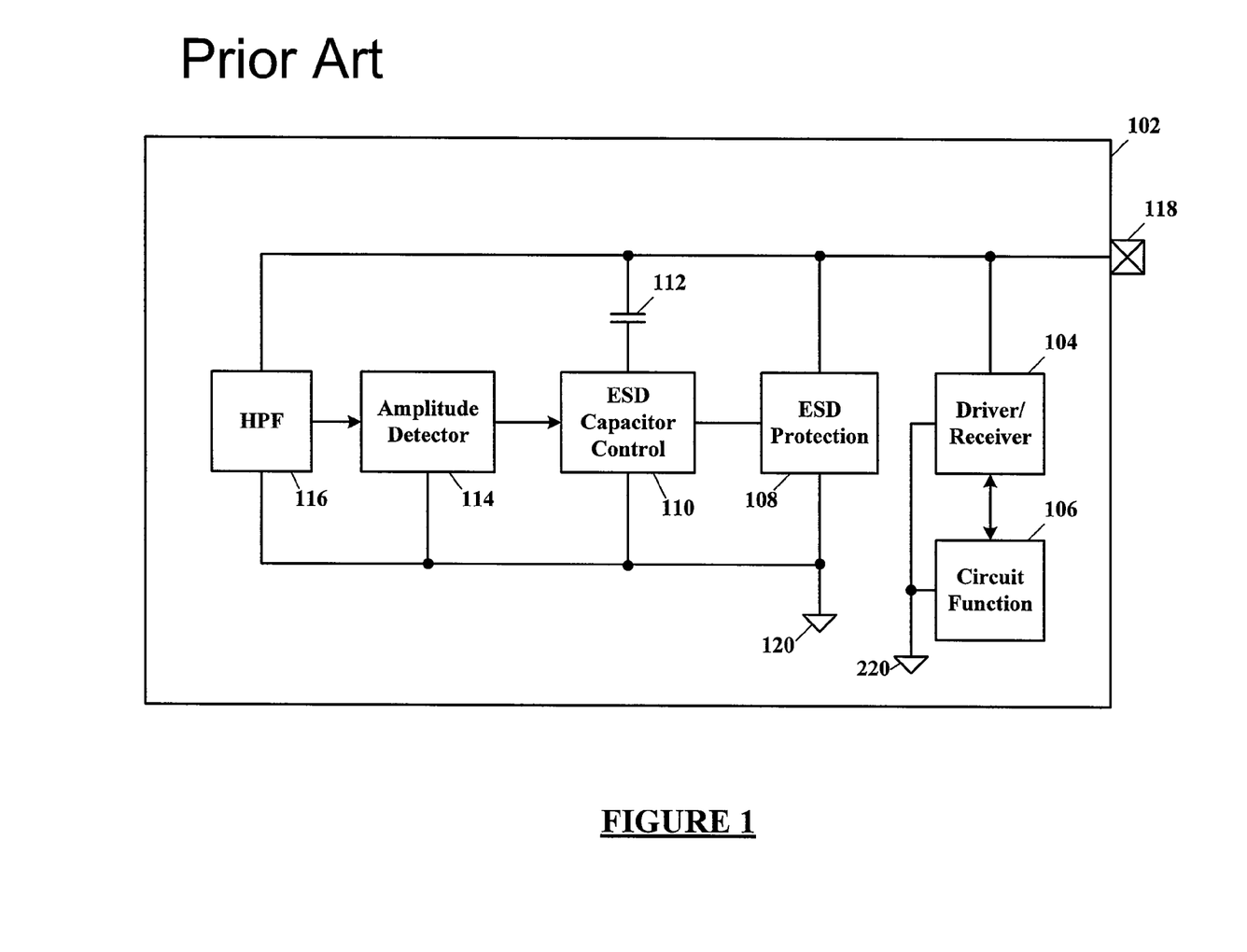
FIG. 1 is a schematic block diagram of a device adaptable for ESD robustness and good DPI/EMI immunity, according to specific example embodiments of this disclosure.

Referring to FIG. 1, depicted is a schematic block diagram of an integrated circuit device adaptable for ESD robustness and good DPI/EMI immunity, according to specific example embodiments of this disclosure. An integrated circuit device, generally represented by the numeral 102, comprises a driver and/or receiver 104 coupled to an external input and/or output (I/O) connection 118 of a packaged or unpackaged integrated circuit die (not shown), a circuit function 106, e.g., analog circuit function, digital logic circuit function and/or mixed signal circuit function, coupled to the driver/receiver 104 (e.g., LIN bus interface), ESD protection circuit 108, an ESD enhancement capacitor 112, an ESD capacitor control 110, a signal coupling high pass filter (HPF) 116, and a signal amplitude detector 114. The driver and/or receiver 104 and the circuit function 106 may be coupled to a signal ground 220, e.g., a signal ground ring. The ESD protection circuit 108, the ESD capacitor control 110, the signal amplitude detector 114 and the signal coupling high pass filter (HPF) 116 may be coupled to an ESD ground or common 120, e.g., an ESD ground ring. The signal ground 220 and the ESD ground or common 120 may be connected to an external ground or common connection 222 (FIG. 2).

The ESD enhancement capacitor 112 is coupled to the ESD protection circuit 108 by the ESD capacitor control 110 when there is substantially no signal detected by the signal amplitude detector 114. When a signal is detected on the I/O connection 118 by the signal amplitude detector 114, the ESD capacitor control 110 decouples, bypasses or attenuates the ESD enhancement capacitor 112 from the ESD protection circuit 108. Thus optimal ESD protection and DPI/EMI immunity are achieved as needed.

Figure 2:
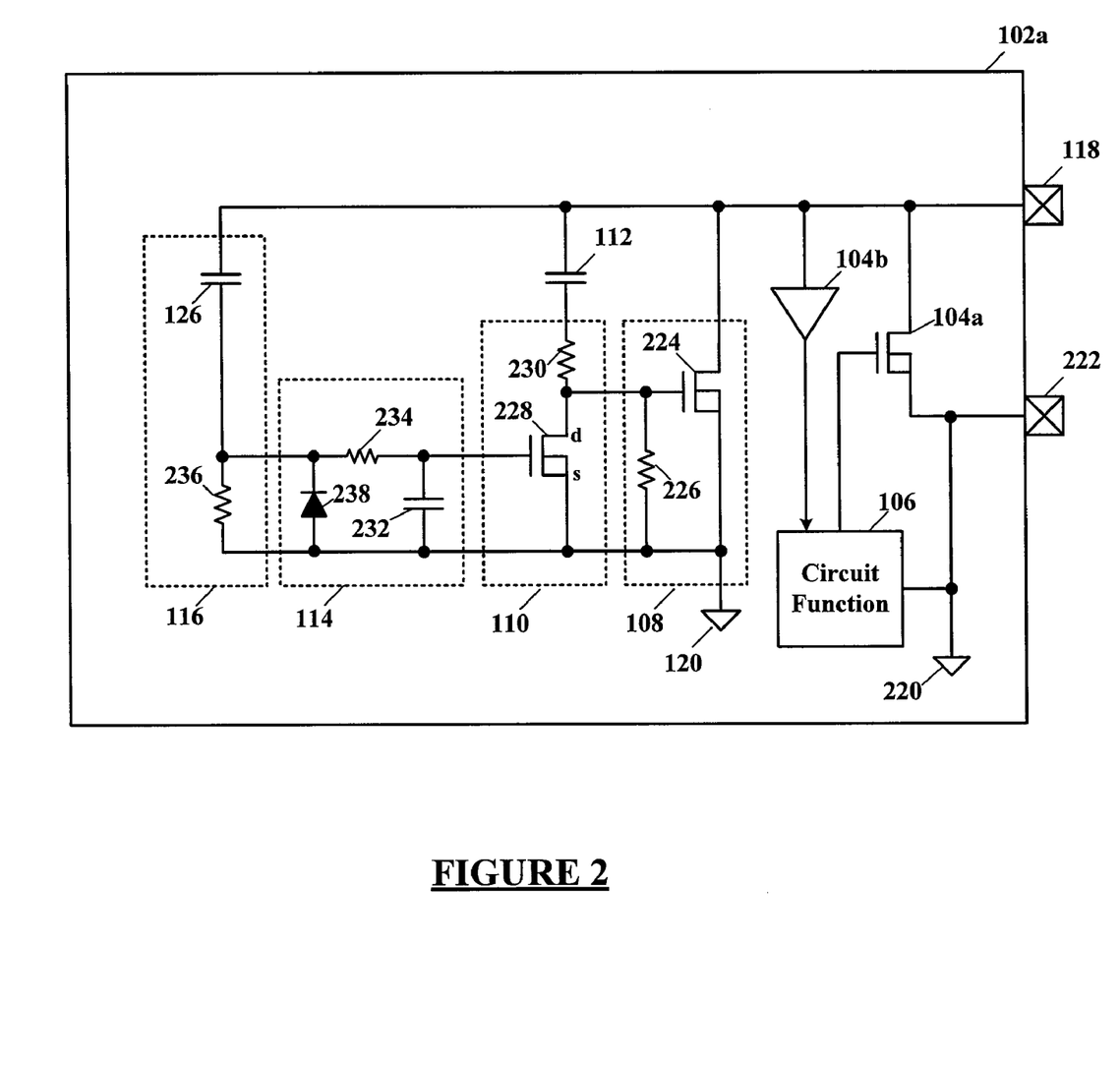
FIG. 2 is a schematic diagram of an implementation of a specific example embodiment of the ESD and DPI/EMI optimization circuits of FIG. 1.

Referring to FIG. 2, depicted is a schematic diagram of an implementation of a specific example embodiment of the ESD and DPI/EMI optimization circuits of FIG. 1. The driver 104a may be an open drain transistor, a tri-state driver, etc. The receiver 104b may be a level detector. The receiver 104b and/or driver 104a is/are coupled to the external input/output (I/O) connection 118 and to the signal ground 220 which is connected to the external ground or common connection 222 that may be located on an integrated circuit package of the integrated circuit device 102a. The integrated circuit device 102a may be used for example but is not limited to LIN module implementation. It is contemplated and within the scope of this disclosure that any type of input-output interface may benefit from the teachings of this disclosure.

The I/O connection 118 is protected by the ESD protection circuit 108 that comprises a metal oxide semiconductor (MOS) device 224 in a grounded gate configuration and is used as an ESD protection device. The ESD protection MOS device 224 source is coupled to the ESD ground or common 120, the drain is coupled to the I/O connection 118 to be protected, and the gate is returned to the ESD ground or common 120 through a gate resistor 226. The ESD ground or common 120 may be further coupled to the external ground or common connection, e.g., connection 222.

The ESD enhancement capacitor 112 when coupled between the source and gate of the ESD protection MOS device 224 will improve ESD protection and reduce the snap back voltage of the MOS device 224. The MOS device 228 will normally be off when substantially no voltage is present on its gate, thereby allowing the ESD enhancement capacitor 112 to be coupled between the source and gate of the MOS device 224, whereby the ESD robustness is maximal. This occurs when no high frequency DPI signal/perturbation is present, e.g., when the LIN part is out of the system or there is substantially no DPI signal/perturbation present. The Data signal is much lower in frequency than the DPI signal/perturbation (noise) and is thereby blocked by the HPF 116, so only when the high frequency DPI noise is present will the MOS device 228 be turned on.

A low value resistance 230 may also be coupled in series with the ESD enhancement capacitor 112. When a voltage is applied to the gate of the switching MOS device 228, the ESD enhancement capacitor 112 is effectively bypassed to the ESD ground or common 120, thereby removing any influence that it may have on the MOS device 224. The low value resistance 230 improves the efficiency of the switching (bypassing) MOS device 228.

It is contemplated and within the scope of this disclosure that the ESD capacitor control 110 may decouple the ESD enhancement capacitor 112 from the gate and/or drain of the MOS device 224 to accomplish substantially the same result as does bypassing the ESD enhancement capacitor 112 from the gate of the MOS device 224.

The ESD capacitor control 110 may also be an ESD capacitor attenuator by operating the MOS device 228 in its linear range and not as a switch. The attenuation becomes a function of the resistance value of the resistor 230 and the equivalent resistance of the MOS device 228. Thus the MOS device 228 may be used to adjust the drain-to-gain coupling of the ESD enhancement capacitor 112 so that proportional ESD protection may be provided according to the strength of the signal (DPI) on the I/O connection 118. So that the attenuation adapts to the DPI level and the drain-to-gate capacitive coupling is always maintained to a level that prevents the ESD protection MOS device 224 from being undesirably turned on.

The voltage applied to the gate of the switching device 228 is supplied by the signal amplitude detector 114. The signal amplitude detector 114 may comprise a signal rectifying diode 238, a low pass filter resistor 234 and a low pass filter capacitor 232. The high-pass filter 116 may comprise a coupling/high-pass filter capacitor 126 and a load/high-pass filter resistor 236. The high-pass filter 116 lets the perturbation (high frequency) signal reach the input of the signal amplitude detector 114, but blocks the data (low frequency) signal. The order of the high-pass filter 116 depends on the difference between the lowest DPI frequency that needs to reach the input of the signal amplitude detector 114 and the maximum data frequency. According to the teachings of this disclosure, the minimum DPI frequency needing to be detected by the signal amplitude detector 114 may be 1 MHz (HF) while a maximum data rate of 20 Kbaud induces, for example, a maximum data frequency of 10 KHz (LF). Therefore a first order high-pass filter 116 is sufficient to let the DPI perturbation reach the input of the signal amplitude detector 114 while blocking the data signal. So only a DPI perturbation signal, with or without a data signal present, will pass to the signal amplitude detector 114 from the HPF 116. If there is substantially no DPI perturbation signal (HF) present, even if a strong data signal (LF) is present, the signal amplitude detector 114 will not activate the ESD capacitor control 110. Thus the capacitor 112 remains in the ESD circuit during reception of the data signal when there is substantially no DPI perturbation noise present. However, if a strong DPI signal is superimposed on a data transmission/reception, the DPI signal will be detected and the capacitor 112 will be decoupled to prevent or substantially reduce possible data corruption.

When a perturbation signal, e.g., a pulse train of on and off voltages, on the I/O connection 118 is coupled through the high-pass filter 116 to the signal amplitude detector 114, the diode 238 rectifies the received signal to produce a pulsating direct current (DC) voltage that is smoothed and filtered in the low pass filter comprising the resistor 234 and capacitor 232. The low pass filter introduces a delay from first detection of the received signal to generating the control voltage for the gate of the switching MOS device 228. This delay is of no consequence since the delay is much shorter than the pulse duration width of data signals normally processed by the circuit function 106 and either transmitted or received at the I/O connection 118.

Figure 3:
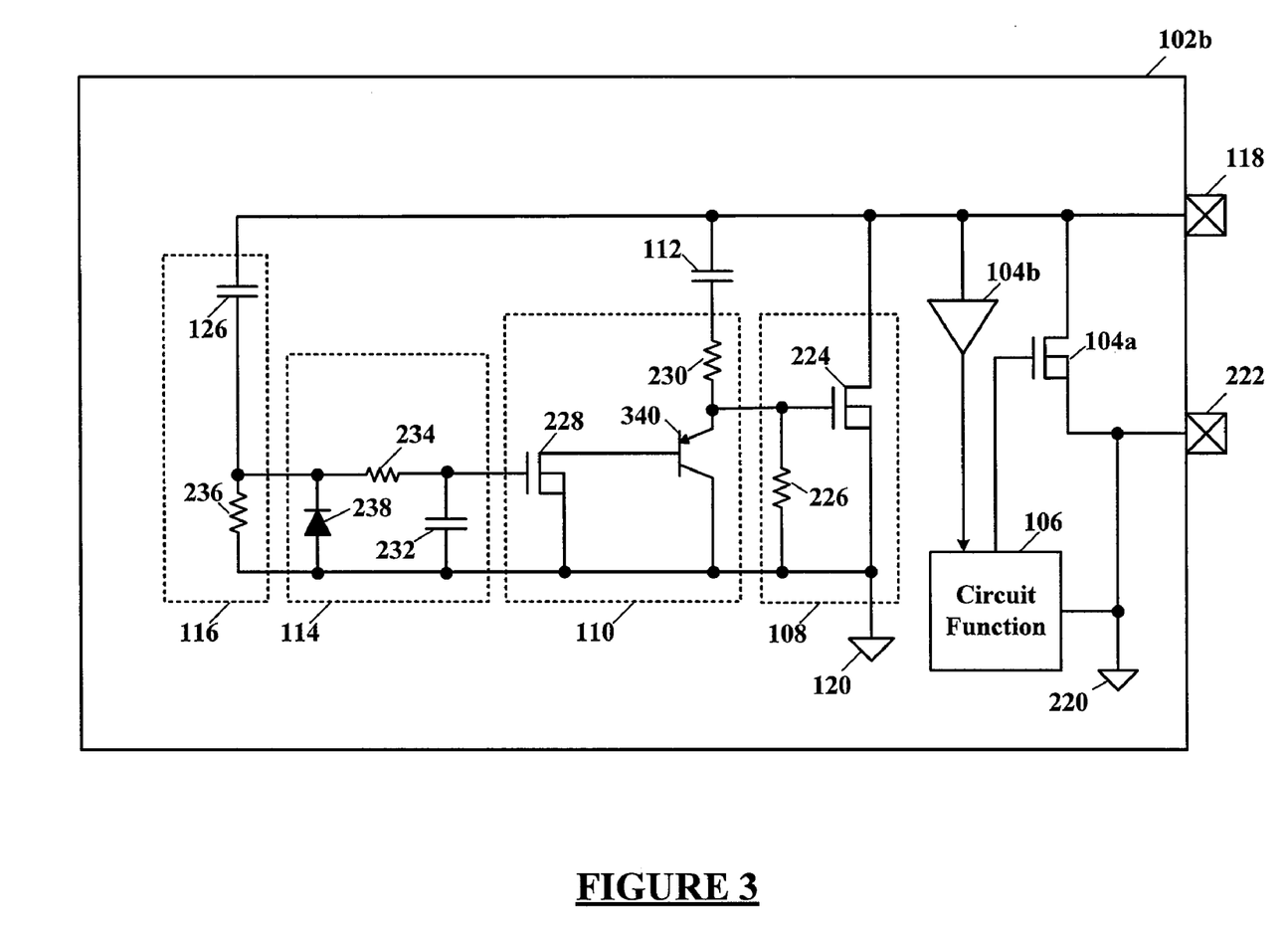
FIG. 3 is a schematic block diagram of an implementation of another specific example embodiment of the ESD and DPI/EMI optimization circuits of FIG. 1.

Referring to FIG. 3, depicted is a schematic block diagram of an implementation of another specific example embodiment of the ESD and DPI/EMI optimization circuits of FIG. 1. The circuits shown in FIG. 3 operate substantially the same as the circuits described hereinabove for FIG. 2, except that a bipolar transistor 340 is added to further improve operation of the ESD capacitor control 110 by reducing the equivalent switch resistance. The MOS transistor 228 operates the same as the MOS transistor 228 of FIG. 2, and may operate in off and saturated (on) modes, and/or in a linear mode so that the influence of the ESD enhancement capacitor 112 on the ESD protection MOS device 224 may be varied depending upon the level of signal (DPI) received by the signal amplitude detector 114.

Adding the bipolar device 340 reduces, by a factor of Beta (Beta is the current gain of the bipolar device 340), the resistance of the switching device. Thereby achieving a low switching resistance in a small die area. Moreover the non-linear characteristic of the bipolar device 340 induces a rectifying effect that adds a negative DC component on the voltage applied to the gate of the ESD protection device 224. This negative DC component on the voltage applied to the gate of the ESD protection device 224 helps to put it into cutoff. However, introducing the bipolar device 340 adds a Vbe (0.7 volt) bias voltage in series with the equivalent resistance of the switch. Therefore this technique can only be applied with an ESD MOS device 224 having a threshold voltage higher than the Vbe voltage of the bipolar device 340. The lower limit for the threshold voltage of the MOS device 224 is in the range of 1 volt.

The delay introduced by the low pass filter (resistor 234 and capacitor 232) of the signal amplitude detector 114 allows good protection in case of an ESD event. An ESD event is a transient that contains many high frequencies. Therefore a voltage is built up at the output of the signal amplitude detector 114 after an ESD event. Without the signal amplitude detector 114 delay, this voltage would build up instantaneously and the capacitive coupling through the ESD enhancement capacitor 112 would thereby be substantially bypassed. But the ramping time in the case of an ESD event is in the nanosecond (ns) range while the delay of the low-pass filter is in the range of hundreds of nanoseconds. Therefore the ramping edge of an ESD event is coupled unaffected to the gate of the ESD protective MOS device 224. So the triggering threshold of the ESD protective MOS device 224 remains unchanged. This means that the ESD protection reacts exactly the same way as the basic capacitive coupling technique discussed more fully hereinabove. Or in the case of varying the influence of the ESD enhancement capacitor 112 on the ESD protection MOS device 224 in proportion to a signal detected by the amplitude detector 114 will thereby always maintain a level that prevents the ESD protection MOS device 224 from being undesirably turned on.

Figure 4:
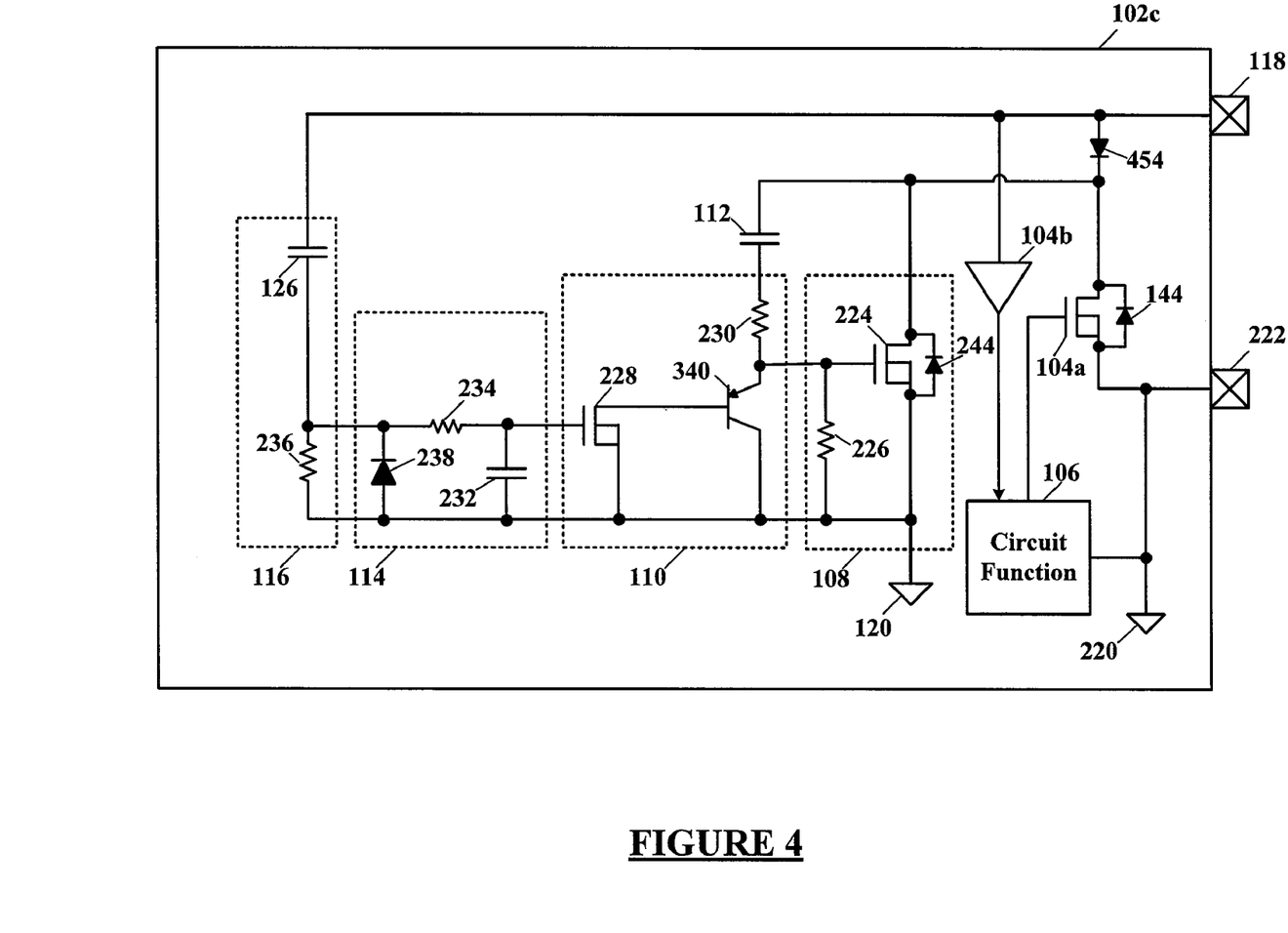
FIG. 4 is a schematic block diagram of an implementation of yet another specific example embodiment of the ESD and DPI/EMI optimization circuits of FIG. 1.

Referring to FIG. 4, depicted is a schematic block diagram of an implementation of yet another specific example embodiment of the ESD and DPI/EMI optimization circuits of FIG. 1. The circuits shown in FIG. 4 operate substantially the same as the circuits described hereinabove for FIG. 2, except that a reverse voltage blocking diode 454 is connected between the I/O connection 118 and the MOS devices 104a and 224. According to the teachings of this disclosure, the protection circuits disclosed herein work fine when the voltage seen on the I/O connection 118 being protected remains positive as referenced to the ground potential, e.g., ESD ground or common 120. However these circuits may be slightly modified when the I/O connection 118 being protected will be subjected to negative voltages as referenced to the ground potential (ESD ground or common 120 and/or signal ground or common 220), which is generally the case for LIN applications. The intrinsic drain to substrate diodes 144 and 244 of the driver device 104a and the MOS ESD protection device 224, respectively, will clamp the voltage on the I/O connection 118 to minus diode junction voltage and thus will not allow the I/O connection 118 to go lower than about −0.7 volt. Therefore the reverse blocking diode 454 preferably is added between the I/O connection 118 and devices 104a and 224, as shown in FIG. 4, to prevent negative voltage clamping of the I/O connection 118.

Figure 5:
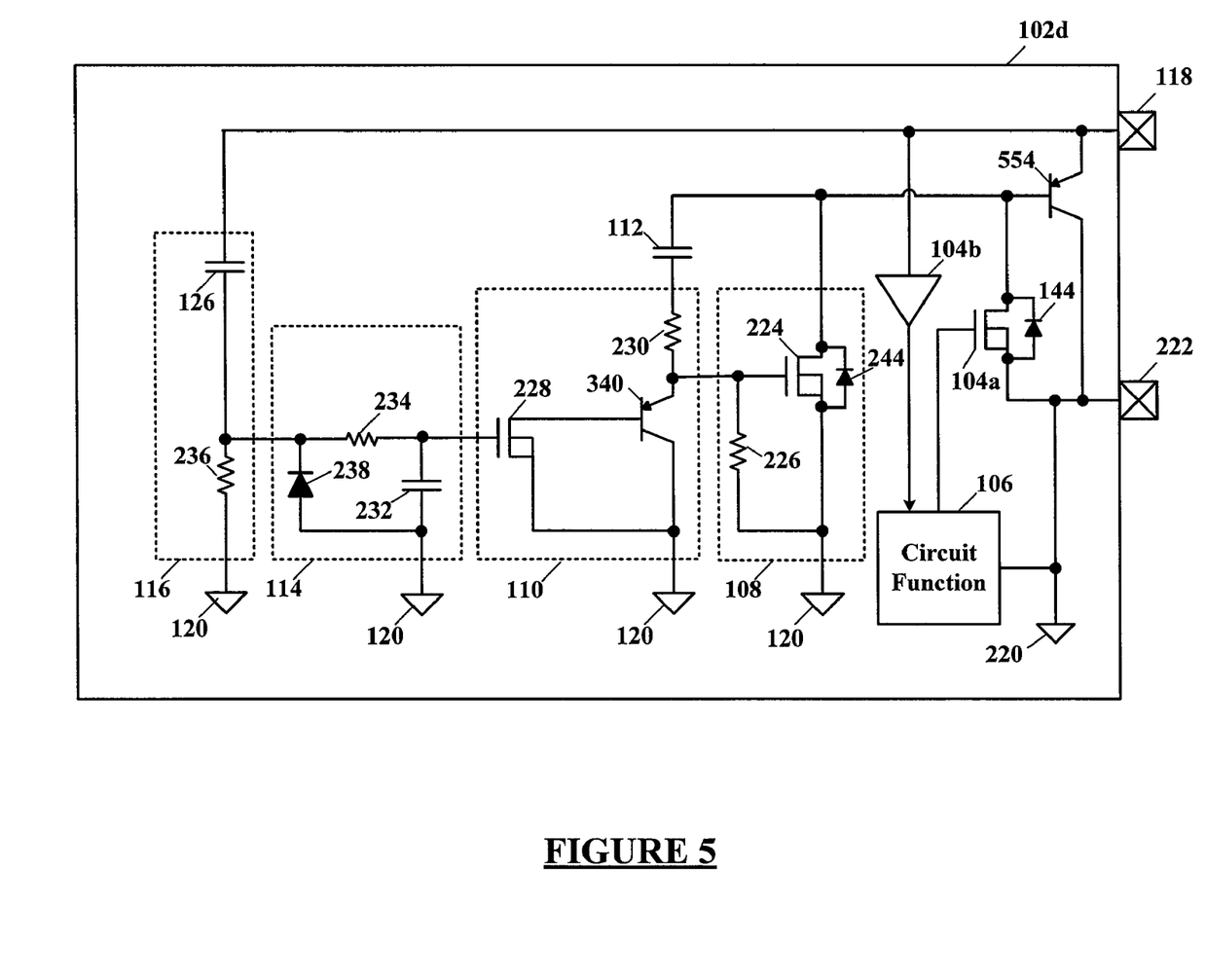
FIG. 5 is a schematic block diagram of an implementation of still another specific example embodiment of the ESD and DPI/EMI optimization circuits of FIG. 1.
Figure 6:
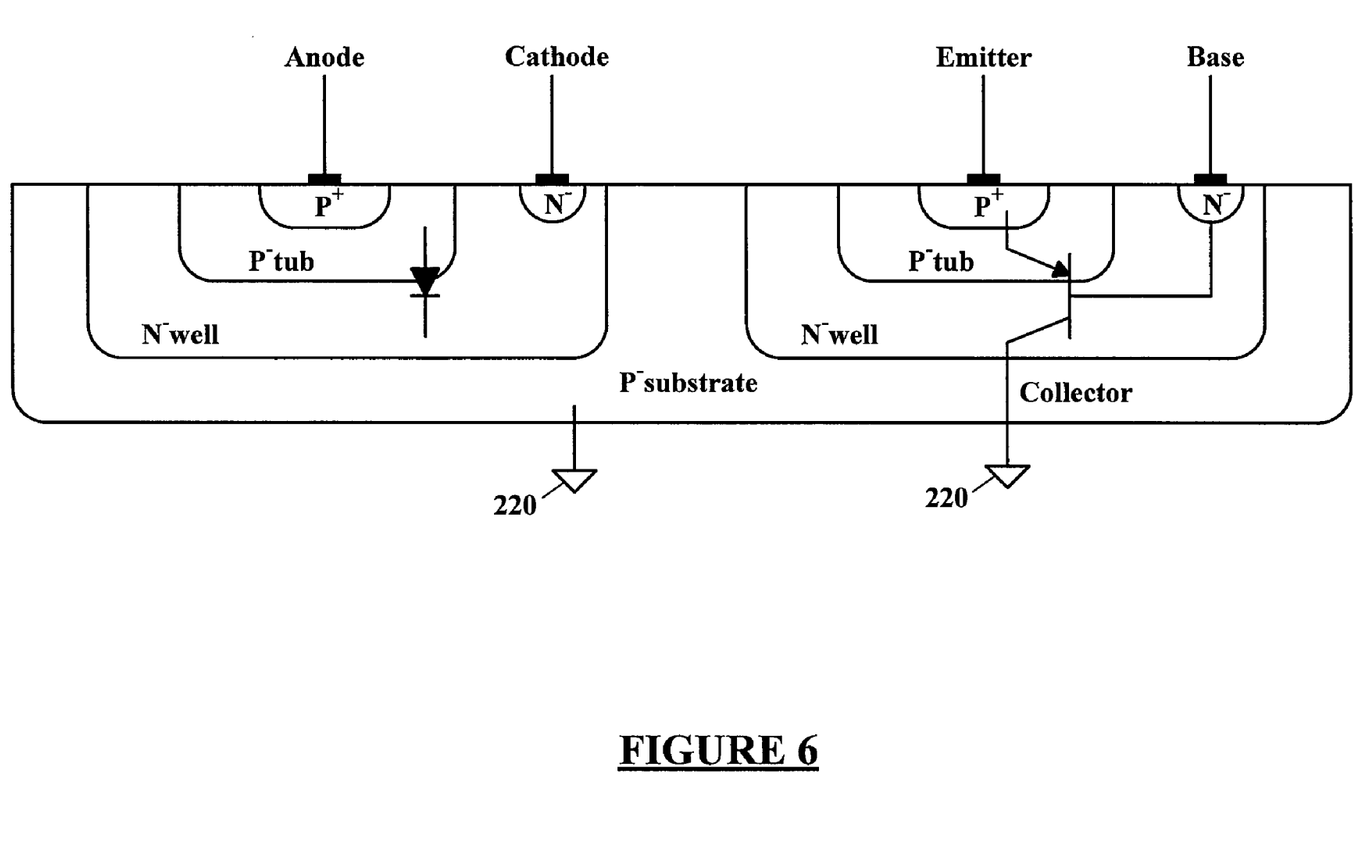
FIG. 6 is a schematic elevational diagram of a typical CMOS fabrication of transistors in a semiconductor substrate.

Referring now to FIGS. 5 and 6, in many CMOS processes true floating diodes don't exist: The diode is built as p-type diffusion in an N-well body. But this N-well body is done in the chip substrate. Therefore, the reverse blocking diode 454 of FIG. 4 is no longer a floating diode but is the base-emitter junction of a vertical PNP device 554 having the substrate as its collector. The cross section of this vertical PNP device 554 for which the emitter is the p-type diffusion, the base is the N-well and the substrate is the collector is shown in FIG. 6. Therefore it is more accurate to consider the reverse blocking diode 454 shown in FIG. 4 as the vertical PNP device 554 shown in FIG. 5.

This new ESD solution allows both high ESD capability and DPI immunity to be self biased: The DPI provides the required control signal to bypass the Drain-to-Gate coupling. Therefore it is functional whenever the integrated circuit device 102 is coupled to the LIN bus. This prevents a LIN module that has lost its supply voltage, e.g., LIN sub-module malfunction or power line malfunction to corrupt data flow on the LIN bus.

While embodiments of this disclosure have been depicted, described, and are defined by reference to example embodiments of the disclosure, such references do not imply a limitation on the disclosure, and no such limitation is to be inferred. The subject matter disclosed is capable of considerable modification, alteration, and equivalents in form and function, as will occur to those ordinarily skilled in the pertinent art and having the benefit of this disclosure. The depicted and described embodiments of this disclosure are examples only, and are not exhaustive of the scope of the disclosure.

What is claimed is:

1. A integrated circuit device having adaptive electrostatic discharge (ESD) protection and noise signal rejection, comprising:
    an external connection adapted for connection to a data bus;
    a data bus interface coupled to the external connection;
    a circuit function coupled to the data bus interface;
    an ESD protection circuit coupled to the external connection and a common of the integrated circuit device;
    an ESD enhancement capacitor coupled to the external connection;
    an ESD capacitor control, wherein the ESD capacitance control proportionally couples the ESD enhancement capacitor into the ESD protection circuit when an input of the ESD capacitor control is at certain control voltages until a maximum voltage is reached then the ESD capacitor control decouples the ESD enhancement capacitor from the ESD protection circuit when the input of the ESD capacitor control is at the maximum voltage;
    a high pass filter coupled to the external connection, wherein the high pass filter passes high frequency noise signals but not low frequency data signals; and
    a signal amplitude detector coupled to the high pass filter, wherein when the high frequency noise signals are present on the external connection the signal amplitude detector applies the certain control voltages to the ESD capacitor control in proportion to the high frequency noise signals received by the signal amplitude detector.

2. The integrated circuit device of claim 1, wherein the data bus interface is a data bus receiver.

3. The integrated circuit device of claim 1, wherein the data bus interface is a data bus driver.

4. The integrated circuit device of claim 1, wherein the data bus interface is a data bus driver and receiver.

5. The integrated circuit device of claim 1, wherein the high frequency noise signals are direct power injection (DPI) signals.

6. The integrated circuit device of claim 1, wherein the high frequency noise signals are electromagnetic interference (EMI) signals.

7. The integrated circuit device of claim 1, wherein the ESD protection circuit comprises a first metal oxide semiconductor (MOS) device.

8. The integrated circuit device of claim 7, wherein the first MOS device is configured having a substantially grounded gate.

9. The integrated circuit device of claim 1, wherein the ESD capacitor control comprises a second metal oxide semiconductor (MOS) device having a gate coupled to the an output of the signal amplitude detector.

10. The integrated circuit device of claim 1, wherein the signal amplitude detector delays the certain control voltages after detecting the high frequency noise signals on the external connection.

11. The integrated circuit device of claim 1, wherein the signal amplitude detector comprises a signal detection diode and a low pass filter.

12. The integrated circuit device of claim 1, wherein the circuit function is a digital logic function.

13. The integrated circuit device of claim 1, wherein the circuit function is an analog circuit function.

14. The integrated circuit device of claim 1, wherein the circuit function is a mixed signal circuit function.

15. The integrated circuit device of claim 1, further comprising a diode coupled between the external connection and the ESD enhancement capacitor and the ESD capacitor control.

16. The integrated circuit device of claim 15, wherein the diode is a vertical PNP device formed during fabrication of the integrated circuit device.

17. The integrated circuit device of claim 1, wherein the data bus is a Local Interconnect Network (LIN) bus.

18. The integrated circuit device of claim 1, wherein the data bus is a Controller Area Network (CAN) bus.

* * * * *